United States Patent [19]
Smith

[11] Patent Number: 6,131,079
[45] Date of Patent: Oct. 10, 2000

[54] METHOD AND DEVICE FOR AUTOMATIC SIMULATION VERIFICATION

[75] Inventor: Michael B. Smith, Etobicoke, Canada

[73] Assignee: LSI Logic Corporation, Milpitas, Calif.

[21] Appl. No.: 08/941,718

[22] Filed: Oct. 1, 1997

[51] Int. Cl.$^7$ .............................. G06G 7/62; G06F 17/50
[52] U.S. Cl. ................. 703/13; 703/14; 703/17; 703/20; 703/21; 714/25; 714/33; 714/736
[58] Field of Search ...................... 395/500.34, 500.35; 714/25, 31, 33, 47, 736, 737; 702/84; 703/14, 17, 20, 21, 13

[56] References Cited

U.S. PATENT DOCUMENTS

| | | | |
|---|---|---|---|
| 5,428,766 | 6/1995 | Seaman | 395/200.45 |
| 5,617,430 | 4/1997 | Angelotti et al. | 371/27 |
| 5,808,919 | 9/1998 | Preist et al. | 364/579 |
| 5,922,079 | 7/1999 | Booth et al. | 714/26 |

OTHER PUBLICATIONS

Amato et al, "Checking Linked Data Structures", IEEE Twenty–Fourth International Symposium on Fault–Tolerant Computing, 1994, pp. 164–173, Jun. 1994.

*Primary Examiner*—Kevin J. Teska
*Assistant Examiner*—Samuel Broda

[57] ABSTRACT

A method and device for automatically verifying results of a simulation is disclosed. External stimuli are applied to a device under test and observed output is generated in response thereto. The observed output is applied to a non-cycle accurate model of the device comprising procedures which simulate significant events corresponding to the significant events of the observed output. Verification conditions are set according to the aspects of the device under test which are being tested and the verification conditions are applied to the output from the non-cycle accurate model. The verification conditions are associated with a procedure of the model such that the verification condition is verified before or after execution of the procedure. In addition, the verification conditions may be executed at the end of the simulation to ensure that all events which should have occur, have occurred. It is possible to control which observed outputs are applied to the model so that a user can interactively observe changes in the state of the model. If a verification condition is not satisfied, an error flag is raised marking a part of the model output which did not satisfy a verification condition.

29 Claims, 8 Drawing Sheets

FIG._1

| LOG FILE: 40 | BUS NUMBER | TIME STAMP | MESSAGE |
|---|---|---|---|
| | 0 | 10ns | DATA-WRITE 100 |
| | 0 | 20ns | DATA-WRITE 110 |
| | 2 | 30ns | DATA-READ 100 |
| | 2 | 40ns | DATA-READ 110 |
| | 0 | 50ns | DATA-WRITE 200 |
| | 0 | 60ns | DATA-WRITE 210 |
| | 2 | 70ns | DATA-READ 210 |

VERIFICATION CONDITIONS:

1 FIFO DEPTH ≤ 2
2 FIFO NON-EMPTY ON A READ
3 DATA RETURNED FROM FIFO IS THE SAME AS IN THE LOG FILE
4 FIFO IS EMPTY AT THE END OF THE SIMULATION

MODEL OF FIFO:

- ADDRESS/COMMAND REGISTER WITH VALID BIT
- FIFO
- COUNTERS FOR NUMBER OF DATA TRANSFERS FOR BUS #0 AND BUS #2

} 20A

VERIFICATION CONDITIONS:

1 FIFO DEPTH IS LESS THAN OR EQUAL TO 2
2 FIFO IS NON-EMPTY WHEN DATA IS REMOVED
3 DATA REMOVED FROM FIFO IS THE SAME AS THE LOGGED DATA
4 CANNOT WRITE INTO THE ADDRESS/COMMAND REGISTER IF THE VALID BIT IS 1
5 CANNOT READ FROM THE ADDRESS/COMMAND REGISTER IF THE VALID BIT IS 0
6 CONTENTS OF THE ADDRESS/COMMAND REGISTER ARE THE SAME AS THE LOGGED ADDRESS/COMMAND
7 ADDRESS/COMMAND REGISTER HAS VALID BIT OF 1 AT CYCLE-END
8 ADDRESS/COMMAND REGISTER HAS VALID BIT OF 0 AT CYCLE-END
9 COUNTED NUMBER OF TRANSFERS IS IDENTICAL TO THE NUMBER OF TRANSFERS LOGGED
10 FIFO IS EMPTY AT THE END OF A SIMULATION
11 VALID BID IN ADDRESS/COMMAND REGISTER IS 0 AT THE END OF A SIMULATION

} 23

LOG FILE: 40

| BUS NUMBER | TIME STAMP | MESSAGE |
|---|---|---|
| 0 | 10ns | Memory-Write ADDRESS: 1000 |
| 0 | 20ns | DATA: 132 |
| 0 | 30ns | DATA: 571 |
| 2 | 30ns | Memory-Write ADDRESS: 1000 |
| 2 | 30ns | DATA:132 |
| 0 | 40ns | DATA: 980 |
| 0 | 50ns | Cycle-End: 3 TRANSFERS |
| 2 | 50ns | DATA: 571 |
| 2 | 60ns | DATA: 980 |
| 2 | 70ns | Cycle-End: 3 TRANSFERS |

42 → BUS NUMBER; 44 → TIME STAMP; 46 → MESSAGE; 54a–54j rows; 30

METHOD AND DEVICE FOR AUTOMATIC SIMULATION VERIFICATION

FIELD OF THE INVENTION

This invention relates to a method and device to verify that test devices are operating properly. More particularly, the present invention relates to an automatic simulation verification method and device which can check and verify the observed output from simulations performed on test devices.

BACKGROUND OF THE INVENTION

In the past, there have been many different types of methods and devices proposed for testing devices. These devices verify that the test devices operate properly by applying external stimuli to the test devices during simulations and then verifying that the results of the simulation correspond to the predicted behaviour of the test device.

In order to verify the results of a simulation on a device, the prior art methods and devices generally utilize a predictive methodology. In a predictive methodology, a "cycle accurate model" of the device under test is created in a high level of abstraction, for example written in C or C++. The cycle accurate model is then used to predict the exact behaviour of the device from any external stimuli. In other words, the same external stimuli are applied to the cycle accurate model as are applied to the test device during the simulation. The cycle accurate model then produces an ideal or "predicted" set of results of the test device for a given set of external stimuli or inputs. The "predicted" set of results from the cycle accurate model are compared to the observed results collected during the simulation of the test device. Any discrepancies between the predicted results of the cycle accurate model and the observed results of the simulation indicate there is a flaw in the device.

The prior art has suffered from several disadvantages. One of the disadvantages of the prior art is that it is time consuming to prepare a cycle accurate model for most devices. For example, it is not unusual for development of a cycle accurate model of a device, in order to produce the predicted results, to require one to two months.

It is also time consuming to change a cycle accurate model should any corrections be required in the cycle accurate model, or, should any changes result in the design of the device being tested. Therefore, even though the cycle accurate model is created at a high level of abstraction, the cycle accurate model must still be fairly detailed in order to be able to produce the predicted results in response to the external stimuli or inputs. Therefore, it is clear that preparing and updating of the cycle accurate model requires a great deal of time and resources, which time and resources could be better utilized in designing and debugging the device.

SUMMARY OF THE INVENTION

Accordingly, it is an object of this invention to at least partially overcome some of the disadvantages of the prior art. Also, it is an object of this invention to provide an improved method and device to verify the results of simulations performed on test devices which method and device do not require a detailed model, such as a cycle accurate model, to verify the results of the simulations.

Accordingly, in one of its objects, this invention resides in a method for testing a device which generates output in response to external stimuli, said method comprising the steps of: (a) generating a first set of observed output from the device by applying a first set of external stimuli to the device; (b) generating a first set of model output by applying the first set of observed output to a model of the device; (c) setting at least one verification condition which the model output should satisfy; and (d) determining if the model output does not satisfy one of the verification conditions.

In a further aspect, the present invention resides in a method for verifying observed output generated by a device in response to external stimuli, said method comprising the steps of: (a) developing a model of the device which model can generate model output in response to the observed output; (b) generating model output corresponding to the observed output by applying the observed output to the model of the device; (c) setting at least one verification condition which the model output should satisfy; and (d) determining if the model output does not satisfy one of the verification conditions.

In a still further aspect, the present invention resides in a system for testing a device which generates observed output in response to external stimuli, a simulation checker comprising: a model of the device which can generate model output in response to observed output generated by the device; and condition verification means for verifying that the model output satisfies predetermined verification conditions.

Accordingly, the present invention provides a method and device which utilizes a model and verification conditions to verify the results of a simulation of a test device. One advantage of the present invention is that, because a cycle accurate model need not be made, there is a great time saving in implementing the present invention. For example, verification of the results of the simulation by the present method and device can begin in one or two days, rather than one or two months, as with the prior art. In this way, the results of the simulation can be tested more quickly and the device can be debugged and sold much sooner.

A further advantage of the present invention is that, because a non-cycle accurate model with verification conditions are used, rather than a cycle accurate model, changes to the design can be reflected quickly and simply by changing the verification conditions and/or the model. This provides the result that changes in the design of the device, or, corrections in the model or verification conditions, can be implemented rapidly and with a minimum of resources.

Another advantage of the present invention is that the verification conditions can be incrementally improved with the addition of new verification conditions. For example, additional verification conditions can be incrementally added to verify additional aspects of the results from the simulation, and therefore additional aspects of the device. In this way, the present invention can be used to start verifying results of the simulations very early on, such as with only a single verification condition being set, and then incrementally improved by setting new verification conditions. In this way, automatic verification of the results of simulations can start very early in the project and then adapted to verify additional aspects of the device.

A further advantage of the present invention is that verification conditions can be set which are verified after all of the significant events of the observed output have been applied to the model. These verification conditions identify any events which have failed to occur. For example, if Event #1 should cause Event #2 to occur and Event #1 was observed, but Event #2 was not observed, then an error has arisen. The verification conditions, which are verified after all of the significant events have been applied to the model, are designed to identify this type of error.

In addition, in one embodiment, the present invention flags the precise location in the model output where a verification condition has not been satisfied. This provides the advantage that the flag will identify the discrepancy much closer to the location of the problem which caused the discrepancy, thereby decreasing the designer's time to locate and correct the problem.

In a further embodiment of the present invention, the designer can interactively step through the significant events of the observed output constituting the results of the simulation. By interactively stepping through the significant events of the observed output, it is considerably easier for a designer to locate the precise time at which the non-cycle accurate model's state deviated from that of the device being tested, which is indicative of the location of the problem in the device. This is of great assistance because, quite often, a simulation failure does not become visible until many clock cycles after the actual failure event has occurred.

Further aspects of the invention will become apparent upon reading the following detailed description and drawings which illustrate the invention and preferred embodiments of the invention.

BRIEF DESCRIPTION OF THE DRAWINGS

In the drawings, which illustrate embodiments of the present invention.

DETAILED DESCRIPTION OF THE PREFERRED EMBODIMENTS

Figure 1:
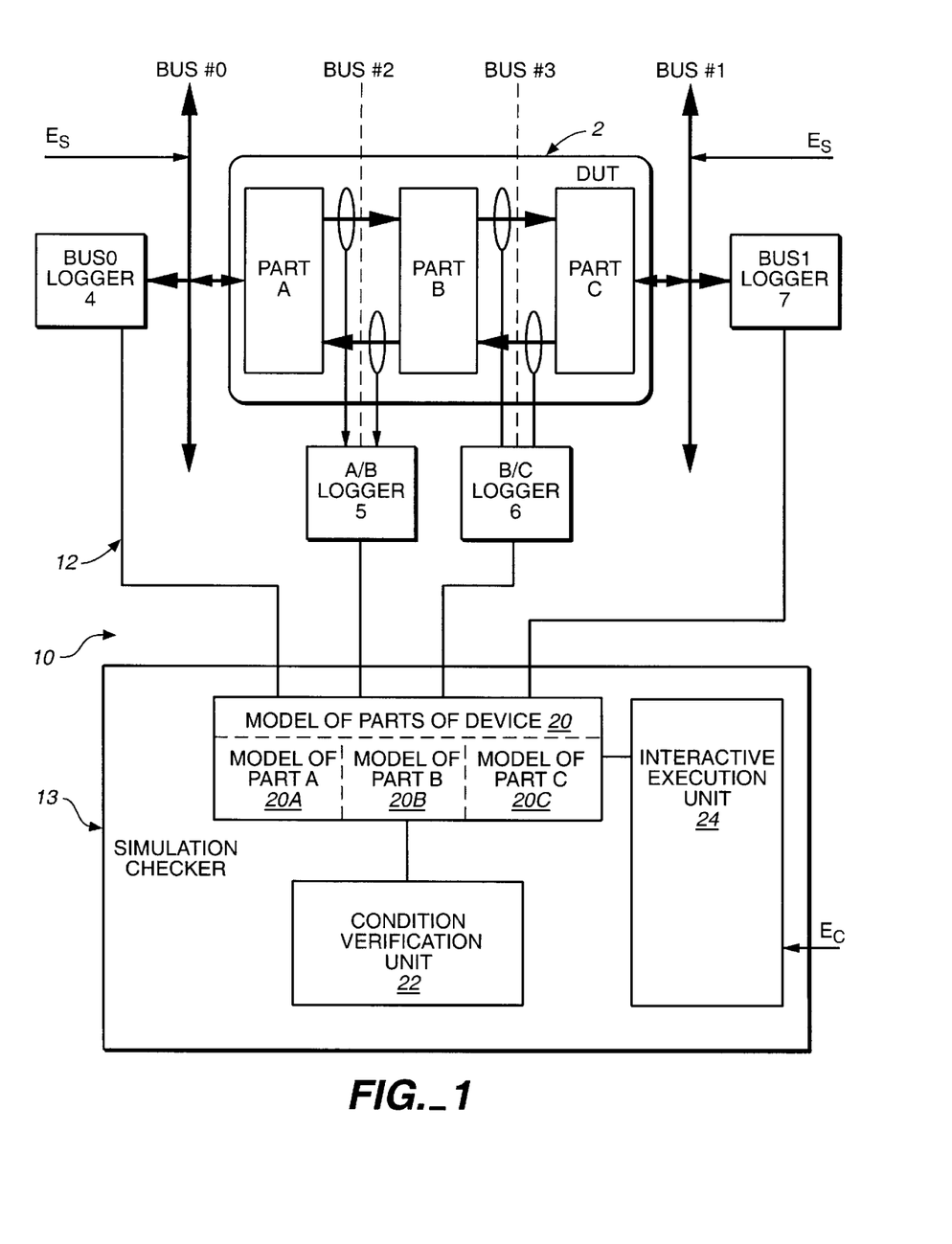
FIG. 1 shows a schematic drawing of a simulation verification environment and simulation checker post processor according to one embodiment of the present invention.

As shown in FIG. 1, one embodiment of the present invention relates to a system, shown generally by reference numeral 10, for testing a device-under-test (DUT) 2. The system 10 comprises a simulation verification environment, shown generally by reference numeral 12 and a simulation checker, shown generally be reference numeral 13. Generally, the simulation verification environment 12 will comprise external buses, such as bus #0 and bus #1, which are located on an external interface of the DUT 2. Bus #0 and bus #1 also generally comprise loggers, such as bus0 logger 4 and bus1 logger 7, respectively, which record the observed output.

The DUT 2 is placed in the simulation verification environment 12 in order to test the DUT 2 in response to various types of external stimuli $E_S$. The DUT 2 can be any type of device which generates output in response to external stimuli $E_S$. The external stimuli $E_S$ can be applied by an external module (not shown) as is known in the art. In general, the external stimuli $E_S$ will be designed to cause the DUT 2 to generate complex output simulating various types of possible events.

In a preferred embodiment, the DUT 2 is separated into parts, such as part A, part B and part C, as shown in FIG. 1. Parts A, B and C are separated from each other by internal interfaces which are identified generally by internal bus #2 and internal bus #3. The internal interfaces can be any type of interfaces where the interaction between the parts A, B and C of the DUT 2 are well defined. In general, parts A, B and C will be delegated to different designers and therefore will be designed and developed independently, thereby making it advantageous to separate the DUT 2 in this manner for independent testing of each of the parts A, B and C. Also, the internal interfaces will be well defined because each designer will have clear interface criteria to permit the parts A, B and C to be combined.

Bus #2 has logger A/B logger 5 and bus #3 has logger B/C logger 6 which log the significant events occurring at the internal interfaces bus #2 and bus #3 separating part A from part B and part B from part C, respectively. The loggers 4, 5, 6 and 7 will log the observed output from the DUT 2, and as well, the observed output between the parts A, B and C for later analysis. The observed output comprises information regarding significant events which occurred on the external interfaces, such as along external bus #0 and external bus #1, and/or the internal interfaces, such as along internal bus #2 and internal bus #3. Therefore, the observed output from external buses #0 and #1 will include the external stimuli $E_S$, and the loggers 4 and 7 will log external stimuli $E_S$.

In general, the loggers 4, 5, 6 and 7 will record information regarding the significant events in fields identifying the internal or external interface by identifying the bus upon which the significant event was observed, the time of occurrence of the significant event and the type of significant event. This information can be stored in one general file or stored in separate files for each of loggers 4, 5, 6 and 7. The checker 13 will parse the information regarding the significant events into components which can be applied to the model 20.

The observed output from the DUT 2 generated in response to the external stimuli $E_S$ is then verified by the simulation checker 13. To accomplish this, the simulation checker 13 comprises a model 20 of the DUT 2. The model 20 of the DUT 2 can generate model output in response to the observed output generated by the DUT 2. The model output is generated by applying the observed output from the DUT 2 to the model 20. The model 20 can mimic external function of the DUT 2 so that applying the observed output to the model 20 causes the state of the model 20 to mimic the DUT 2, but the model 20 cannot generate model output in response to the external stimuli $E_S$ alone.

In other words, the model 20 is a non-cycle accurate model of the DUT 2 comprising procedures which can simulate significant events of the observed output, but the model 20 does not simulate internal constructions of the DUT 2. A non-cycle accurate model mimics the externally visible functionality of the DUT 2, without adhering to the details of its internal construction or external timing. Individual events within the DUT 2 being modeled do not necessarily have corresponding events within the model 20. Instead, the intended functionality of the DUT 2 is encapsulated at a high level of abstraction such that only the external functional behaviour of the DUT 2 is accurately represented. In the case where the DUT 2 is partitioned in parts, such as parts A, B and C, the model 20 may comprise models 20A, 20B and 20C of one or more parts of the DUT 2, depending on the aspects of the DUT 2 which are being tested. The non-cycle accurate models 20A, 20B and 20C of parts A, B and C of the DUT 2 will mimic the external visible functionality of each part A, B and C of the DUT 2, respectively, without adhering to the details of the internal construction or external timing of each part A, B and C of the DUT 2.

The simulation checker 13 further comprises a condition verification unit 22 comprising predetermined verification conditions which the model output should satisfy. The condition verification unit 22 verifies the observed output by determining if the model output satisfies all of the predetermined verification conditions. If the model output does not satisfy one of the verification conditions, then the observed output likely contains an error which should be investigated by the designer. In a preferred embodiment, the condition verification unit 22 flags at least one part of the model output which does not satisfy one or more of the verification conditions.

In a preferred embodiment, the simulation checker 13 comprises an interactive execution unit 24. The interactive execution unit 24 causes the model 20 to execute procedures corresponding to the significant events of the observed output in response to external commands $E_C$. Accordingly, a designer may use the interactive execution unit 24 to step through the significant events in the observed output. This allows a designer to observe changes in the states of the model 20 so that the designer can more easily determine the cause of any errors in the observed output.

Figure 2A:
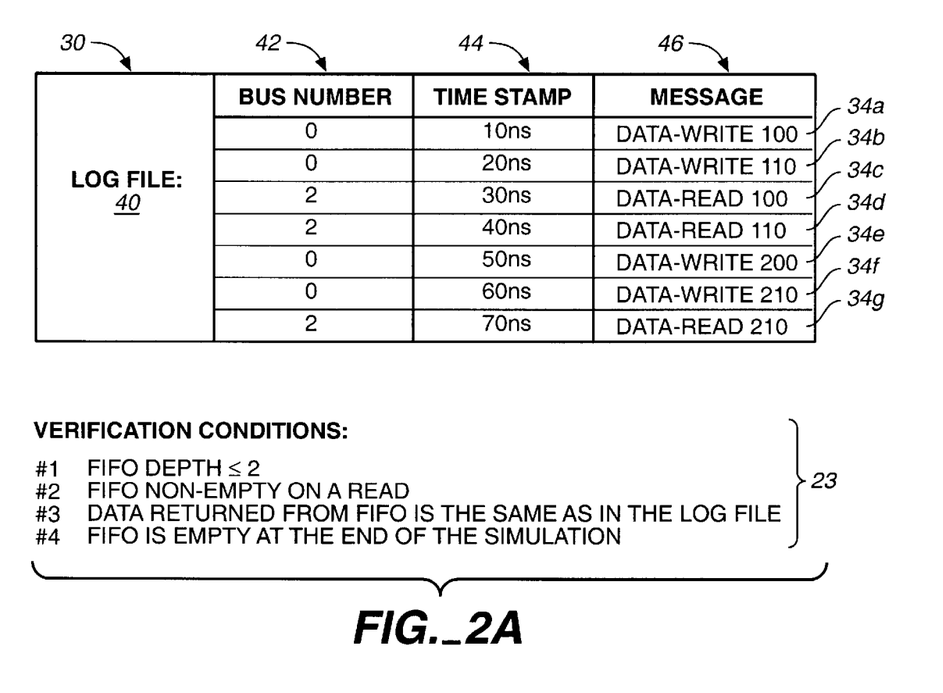
FIG. 2A shows a simplified example of verification conditions and a log file for a test FIFO.
Figure 2B:
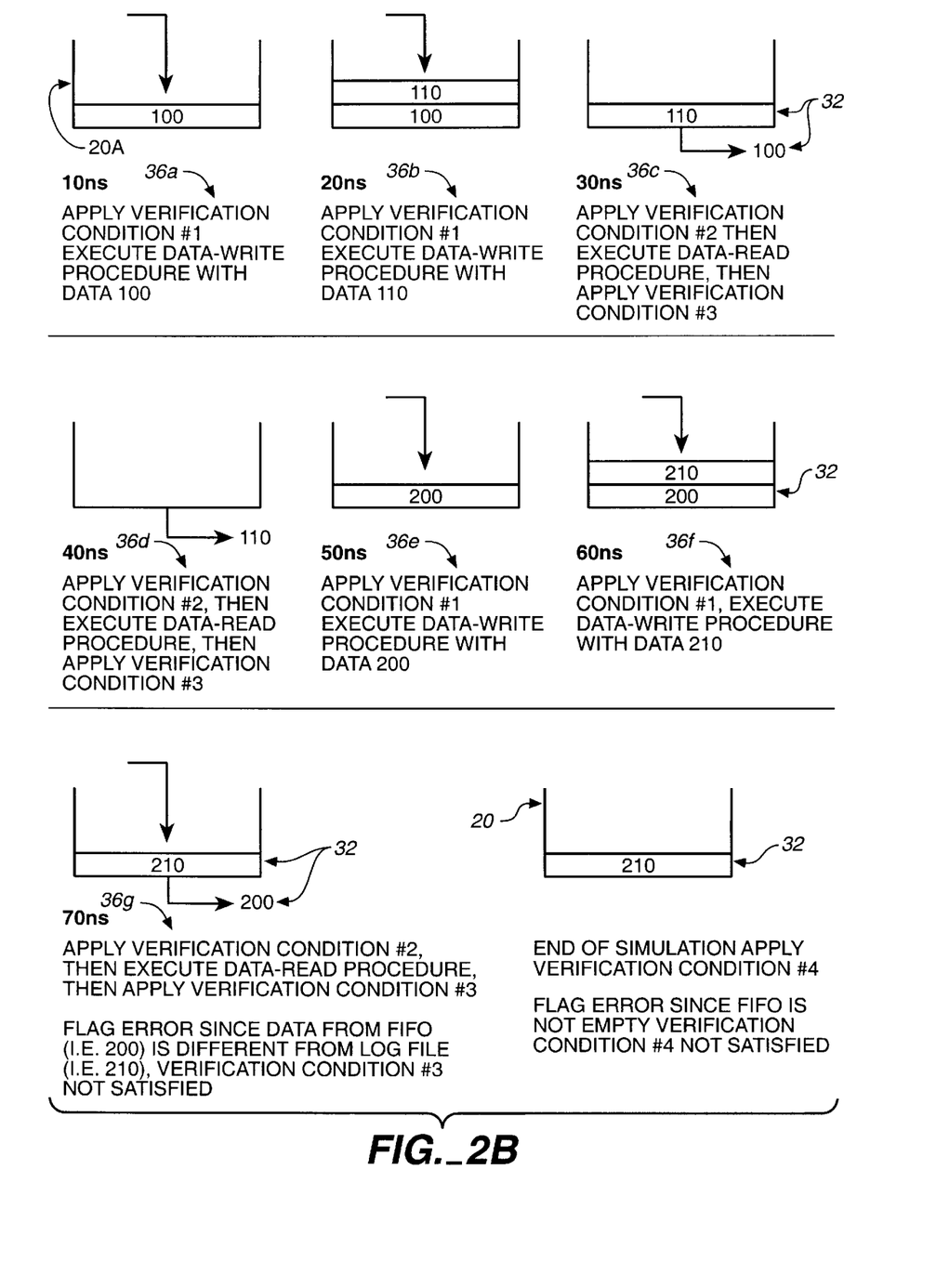
FIG. 2B shows an example checking sequence of the verification conditions and log file shown in FIG. 2A.

FIGS. 2A and 2B show a simplified example of how the present device and method may be used to test a DUT 2. For the purposes of this example, it is assumed that part A of the DUT 2 consists of a FIFO register (not shown) which is being tested.

FIG. 2A shows a log file 40 containing example observed output 30 generated by the test FIFO (not shown) in response to external stimuli $E_S$. Log file 40 identifies which bus the significant events 34a to 34g of the observed output 30 relates to in the field identified as Bus 42. Likewise, the time of the occurrence of the significant event 34a to 34g is identified in the field Time Stamp 44 and the type of the significant event 34a to 34g as well as the corresponding data, is identified in the field Message 46.

Therefore, log file 40 comprises information regarding the observed output 30 from a simulation conducted on a test FIFO register (not shown) comprising part A of the DUT 2. The observed output 30 comprises information regarding the significant events 34a to 34g which occurred at the interfaces of, in this case, part A of the DUT 2. Therefore, log file 40 comprises observed output 30 from the external interface along bus #0 and the internal interface along bus #2 of part A.

The significant events 34a to 34g comprise any non-regular or non-trivial events such as a write or a read from part A of DUT 2. A significant event would not, for example, comprise a clock ticking on the DUT 2 which would always occur. However, field Time Stamp 44 would include the time of occurrence of the significant event 34a to 34g.

FIG. 2A also lists predetermined verification conditions 23 which the observed output 30 from model 20A of part A of the DUT 2 should satisfy. As shown in FIG. 2A, the verification conditions 23 concern the functioning of the part of test FIFO (not shown). The verification conditions have been set to verify various aspects of the observed output 30. For example, one verification condition which has been set is "#1 FIFO depth ≦2". This verification condition has been set because the FIFO register being tested can store a maximum of two packets of data. The other verification conditions, namely, conditions #2, #3 and #4 listed in FIG. 2A, relate to other aspects of part A of the DUT 2.

It is clear that these verification conditions can be amended or cancelled. Also, new verification conditions can be set and the observed output 30 re-verified to test additional aspects of the test FIFO.

FIG. 2B shows an example of a checking sequence to verify the observed output 30 shown by log file 40 in FIG. 2A and constituting the results of a simulation. FIG. 2B depicts several representations of the model 20A, each at different times, to show how the state of the model 20A changes as the observed output 30 is applied to the model 20A. The state of the model 20A includes such aspects as the depth or number of data elements stored in the model 20A at any one time. By applying the observed output 30 to the model 20A, the model 20A generates model output, shown generally by reference numeral 32. The model output 32 includes the data outputted by the model 20A as well as the state of the model 20A.

The model 20A of the example FIFO being tested can consist of a simple software program which mimics the external functions of the FIFO being tested. The model 20A is a non-cycle accurate model as discussed above, and developed by developing procedures, such as procedures 36a to 36f, which simulate the significant events 34a to 34g of the observed output 30 stored in a log file 40. It is clear that the procedures 36a to 36f cause the model 20A to simulate all of the observed output 30 of part A of DUT 2. It is also clear that the model 20A need only simulate significant events 34a to 34g which are listed in the observed output 30, and need not simulate significant events which part A of the DUT 2 could execute, but which are not presently being tested and are not reflected in the observed output 30. Likewise if only part A is being tested, then the model 20 need not include models 20B and 20C of parts B and C.

FIG. 2B depicts a representation of model 20A and the model output 32 for each significant event of the observed output 30. For example, the first significant event 34a of the observed output 30, occurring at 10 ns is a data-write on bus #0 and the corresponding data is "100". This significant event 34a is simulated by the model 20A executing procedure 36a comprising "execute data-write procedure" with the corresponding data of 100. Associated with procedure 36a is the verification condition #1 that "FIFO depth ≦2". Verification condition #1 is associated with data-write procedure such that verification condition #1 is verified before the procedure 36a is executed. It is clear from the depiction of model 20A at 10 ns that the verification condition #1 is satisfied.

At 20 ns, procedure 36b is executed, simulating the next significant event 34b of the observed output 30, namely "data-write", with the corresponding data "110". Once again, verification condition #1 is verified before the corresponding procedure 36b is executed.

At 30 ns, the log file 40 has logged the significant event 34c "data-read" on bus #2. Model 20A simulates this significant event 34c by executing procedure 36c constituting a read from the model 20A. The model output 32 comprises the outputted data "100" read from the model 20A and the state of the model 20A being the value 110 is still stored therein. There are two verification conditions associated with procedure 36c, namely verification conditions #2 and #3. Verification condition #2, similar to verification condition #1, is verified before execution of procedure 36c. However, verification condition #3 is verified after execution of procedure 36c.

In a similar manner, procedures 36d, 36e and 36f are executed to simulate the significant events of the observed output 30 which occurred at 40 ns, 50 ns and 60 ns, respectively. Likewise, the associated verification conditions 23 are verified, either before or after execution of the procedure.

At 70 ns, the significant event 34g logged in log file 40 is a data-read on bus #2 with the value "210" and the model 20A executes the corresponding procedure 36g. However, the model output 32 comprises the outputted data value "200". As the model output 32 is not the same as the data as logged in the log file 40, verification condition #3 is not satisfied. It should be noted that even though the verification conditions 23 are applied to the model output 32, some of the verification conditions 23, such as verification condition #3, may be dependent on the data of the corresponding significant event 34g of the observed output 30.

In a preferred embodiment, the fact that verification condition #3 is not satisfied would be flagged with a brief description of why the verification condition was not satisfied. As shown in FIG. 2B, this description can simply state that an error has occurred because the model output 32 from the model 20A of the FIFO (i.e. 200) is different from the observed output 30 from the log file 40 (i.e. 210). At this time, the designer can compare the state of the model 20A to the log file 40 and investigate the cause of this error.

In a preferred embodiment, a subset of the verification conditions 23 are not executed before or after the procedures 36a to 36g, but rather are executed at the end of the simulation. For example, as shown in FIGS. 2A and 2B, verification condition #4 states that "FIFO is empty at the end of the simulation". Therefore, verification condition #4 is verified at the end of the simulation. In the example shown in FIG. 2B, verification condition #4 is not satisfied because the model output 32, comprising the state of the model 20, is not empty but rather still has the data "210" stored therein. This error, with a brief description, is also flagged.

The example illustrated in FIGS. 2A and 2B show how the present method and simulation checker 13 can be used to verify the observed output 30 from a simulation on a DUT 2 or a part of a DUT 2. As shown by this example, the verification conditions 23 can be set to verify various aspects of the observed output 30, and, a non-cycle accurate model 20 can be developed by developing procedures which simulate significant events of the observed output 30. The model 20A is a non-cycle accurate model in that the internal constructions of the DUT 2 or the part of the DUT 2 need not be simulated, but rather the procedures merely simulate the external visible functioning of part A of the DUT 2, namely the test FIFO.

Furthermore, the model 20 need only simulate the significant events 34a to 34g of the observed output 30 which are being tested, and the model 20A need not be capable of simulating all possible significant events which the DUT 2, or part A of the DUT 2, can generate. When desired, additional aspects of the DUT 2 or the part of the DUT 2 can be tested by applying a new external stimuli $E_S$ to the test FIFO and generating new observed output (not shown). If the new observed output (not shown) has new significant events (not shown), the model 20 can then be incrementally improved by developing additional procedures (not shown) which simulate new significant events (not shown) present in the new observed output (not shown). Likewise, new verification conditions 23 can be set to verify additional aspects of the new observed output (not shown).

Figure 3:
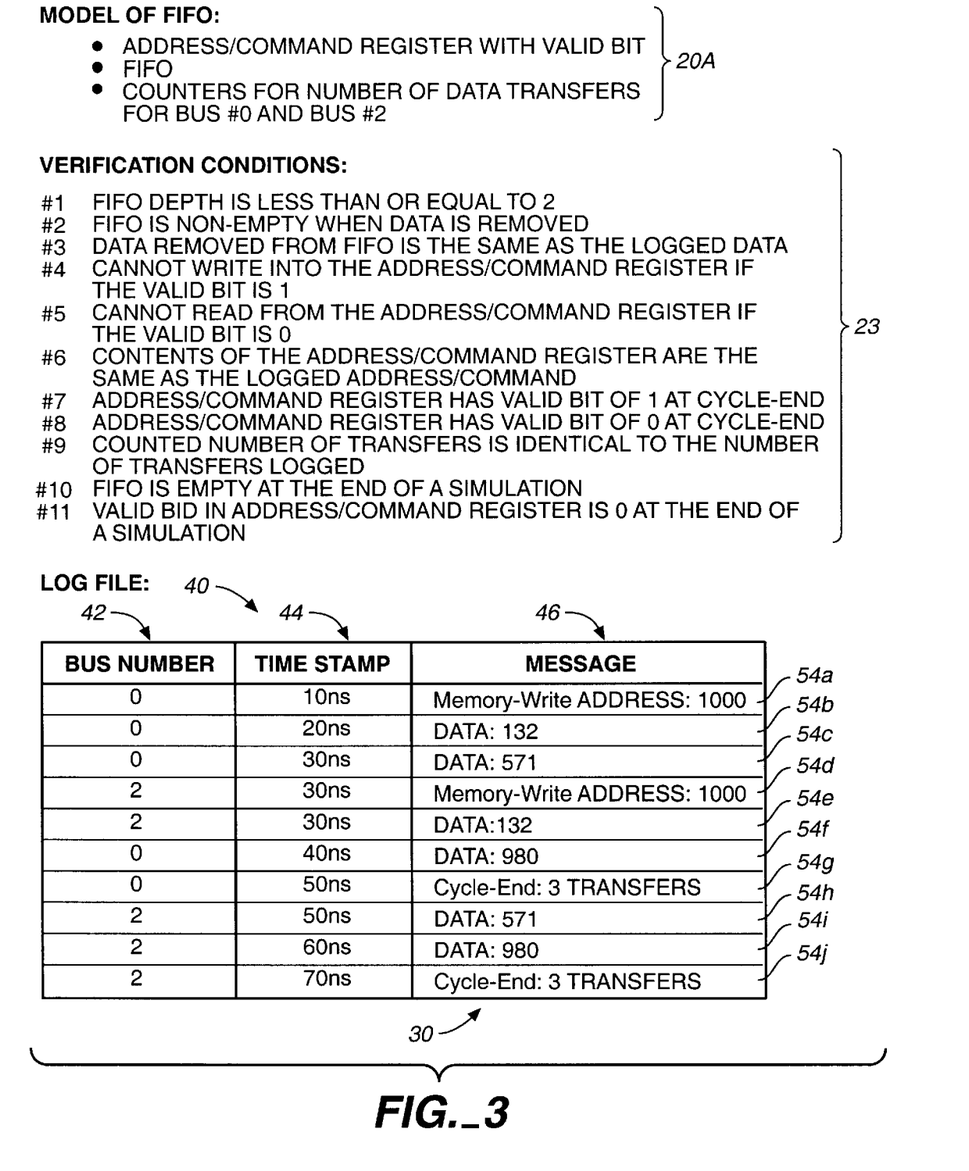
FIG. 3 shows an example of a simple model of a FIFO, verification conditions which may be used to verify the example output of the test FIFO, and an example log file containing results of the simulation on the test FIFO.

By way of a further example, FIG. 3 shows a more detailed model 20A of a test FIFO. Likewise, additional verification conditions 23 have been set to test additional aspects of the test FIFO. FIG. 3 shows a brief description of the model 20A and the verification conditions 23. FIG. 3 also shows a log file 40 comprising observed output 30 for the test FIFO generated in response to new external stimuli $E_S$.

The example illustrated in FIG. 3 is for a test FIFO constituting part A of a DUT 2, similar to the example illustrated in FIGS. 2A and 2B. However, for the example illustrated by FIG. 3, the model 20A and verification conditions 23 are more detailed to test additional aspects of the test FIFO, such as an address/command register with valid bit and bus counters to count the number of data transfers on the external bus #0 and the internal bus #2.

The observed output 30 shown in FIG. 3 is applied to the model 20A and a determination is made as to whether or not one or more of the verification conditions 23 have not been satisfied, as illustrated in FIGS. 4A, 4B, 4C and 4D. The model output 32, consisting of changes in the state of the model 20A and data outputted from the model 20A, are also illustrated in FIGS. 4A, 4B, 4C and 4D.

As was the case with the example illustrated in FIGS. 2A and 2B, model 20A for the example illustrated in FIGS. 3 and 4A, 4B, 4C and 4D, comprises a procedure 56a to 56j which simulates each significant event 54a to 54j of the observed output 30. For example, at 10 ns, the model 20A comprises a procedure 56a to "Store Memory-Write and Address :1000" into address/command register and set the valid bit at 1 which simulates significant event 54a which is "Memory-Write Address: 1000". The model 20A comprises additional procedures 56a to 56j, such as "push number 0 onto FIFO", "set Bus 2—count to 0" and "pop data value from FIFO", as illustrated in FIGS. 4A, 4B, 4C and 4D, to simulate the other significant events 54b to 54j in the observed output 30.

As was also the case with the example illustrated in FIGS. 2A and 2B, the example illustrated in FIGS. 4A, 4B 4C and 4D comprise verification conditions 23 associated with each procedure 56c to 56j. Furthermore, depending on the nature of the procedure 56a to 56j and the verification condition 23, a determination as to whether or not the verification condition 23 is satisfied may be made before execution of the procedure 56a to 56j, as shown at 10 ns when procedure 56a to store a Memory-Write is executed, or after procedure 56b, as shown at 20 ns when data "132" is pushed onto the model 20. In either case, if one of the verification conditions 23 is not satisfied, at least a part of the model output 32 which does not satisfy the verification condition 23 will be flagged.

Figure 4A:
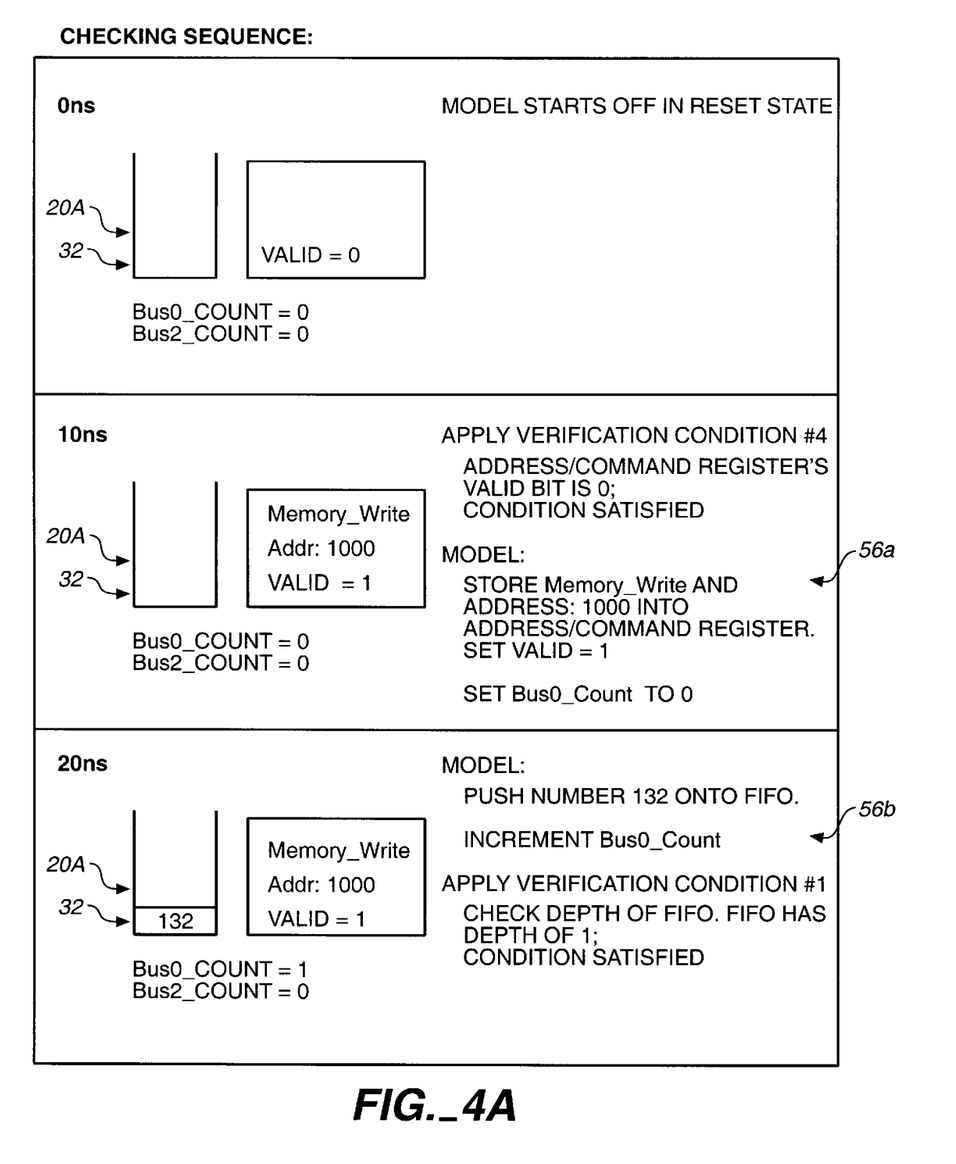
FIGS. 4A, 4B, 4C and 4D show an example checking sequence of the model, verification conditions and example log file shown in FIG. 3.
Figure 4B:
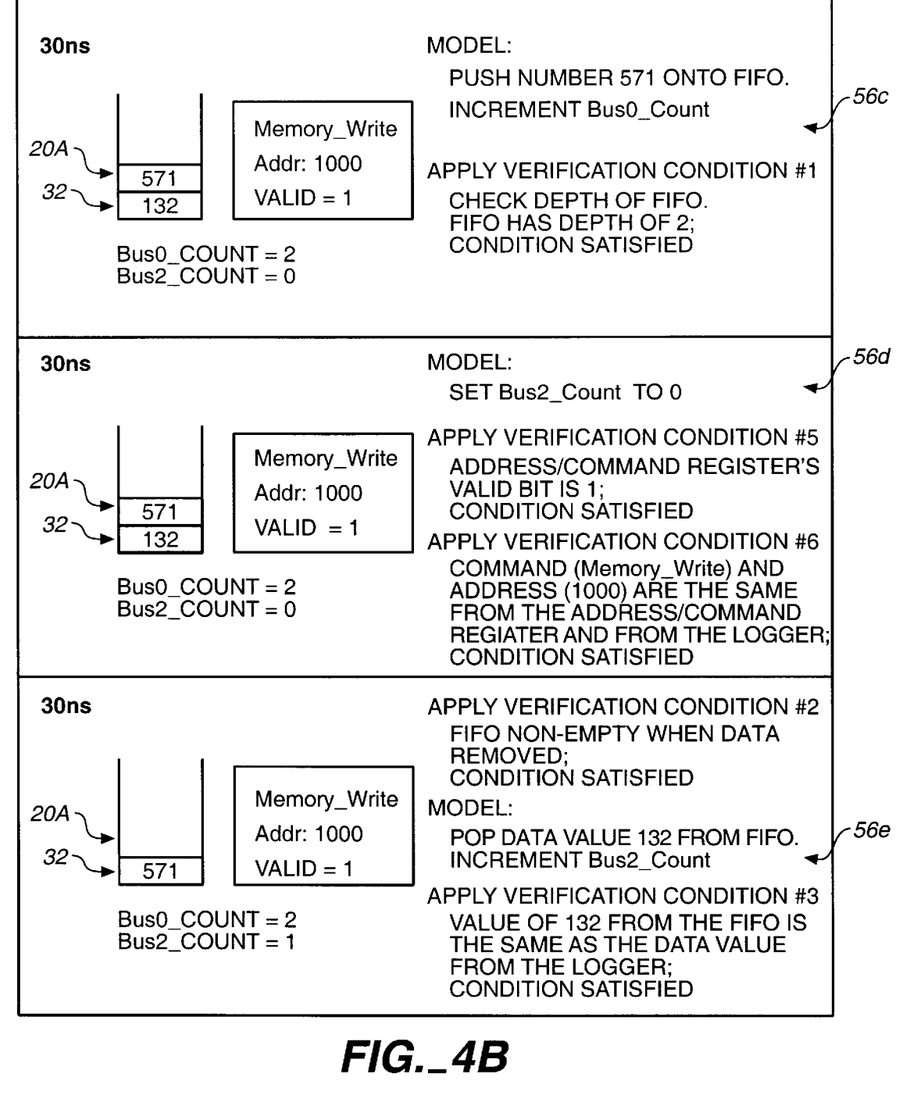
Figure 4C:
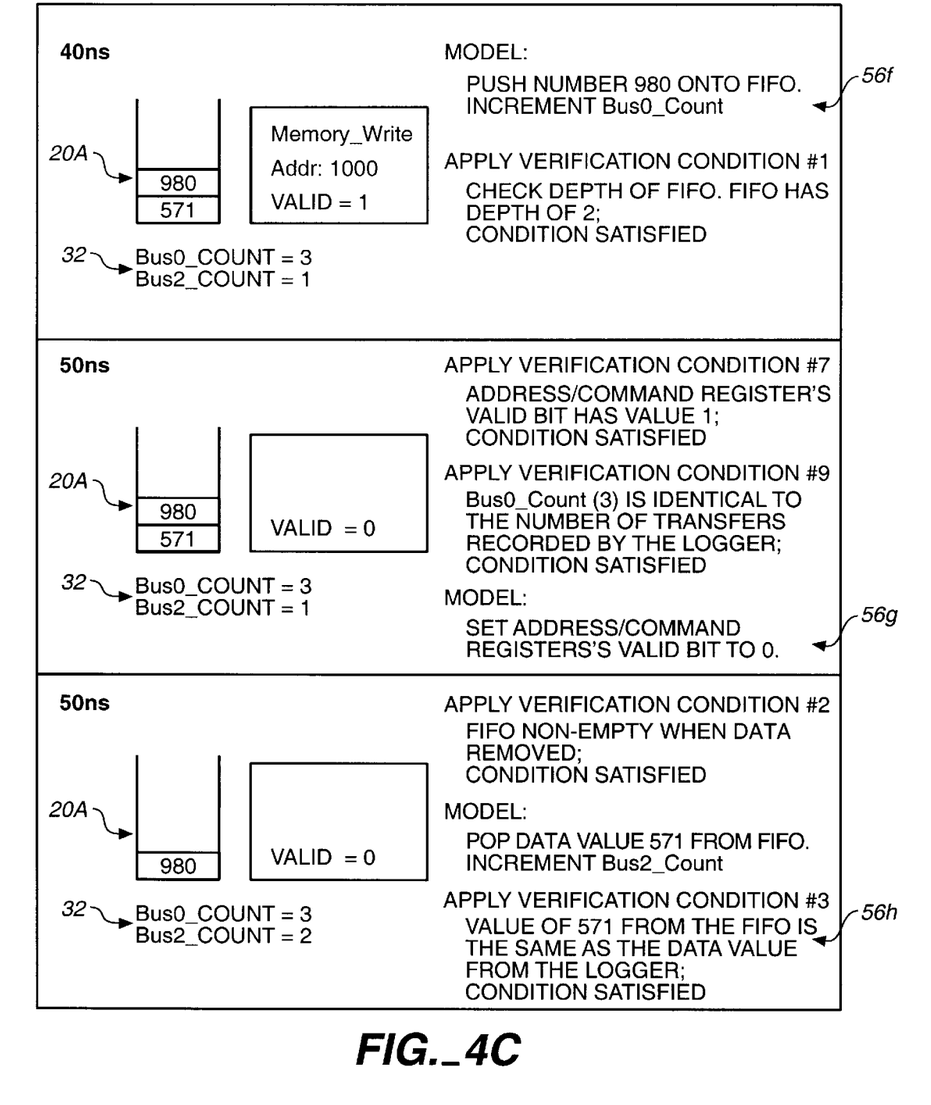
Figure 4D:
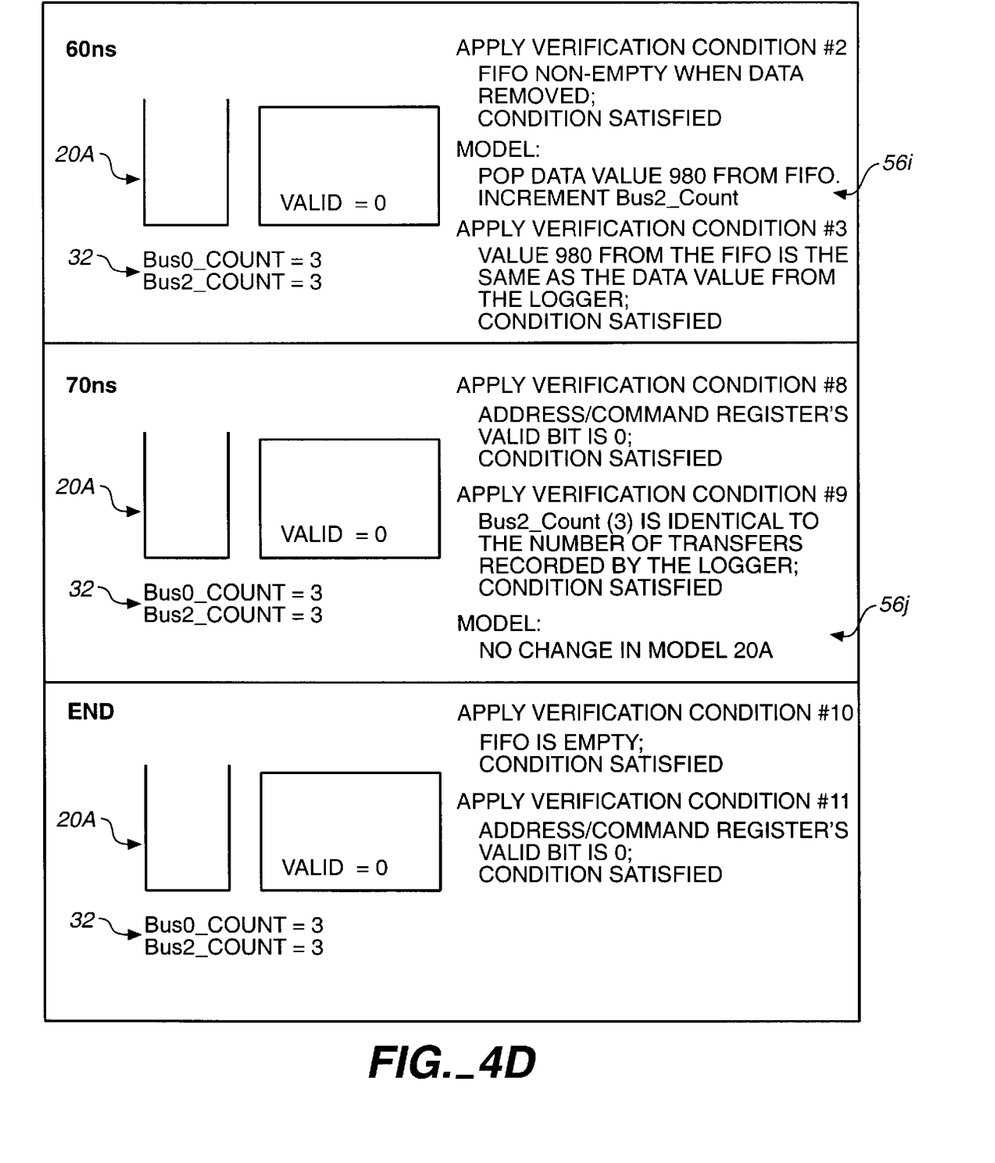

A subset of the verification conditions 23, namely, verification conditions #10 and #11 shown in FIG. 3, are set in order to identify any events which have failed to occur. In this regard, verification conditions #10 and #11 shown in FIG. 3 are similar to verification condition #4 shown in the example illustrated in FIG. 2A. Verification conditions #10 and #11 are set so that if any event has failed to occur which should have occurred, verification conditions #10 and #11 should not be satisfied. This was the case with verification condition #4 of the example illustrated in FIG. 2B. FIG. 4D shows that the model FIFO is empty at the end of the simulation and that the valid bit in the address/command registers 0. Therefore, both verification conditions #10 and #11 are satisfied.

Accordingly, as shown from the examples illustrated in FIGS. 2A, 2B, 3, 4A, 4B, 4C and 4D, the model 20A comprises procedures 36a to 36g and 56a to 56j which simulate the significant events 34a to 34g and 54a to 54j, respectively, in the observed output 30 of the corresponding example. Also, a subset of the verification conditions 23, such as conditions #2, #4, #7, #8 and #9 in the example illustrated in FIG. 3, can be associated with procedures 56a, 56e, 56g, 56h, 56i and 56j such that the verification conditions #2, #4, #7, #8 and #9 are verified before execution of the associated procedure 56a, 56e, 56g, 56h, 56i and 56j. Likewise, a subset of the verification conditions 23, such as verification conditions #1, #3, #5 and #6, can be associated with procedures 56b, 56c, 56d, 56e, 56f and 56i, such that the verification conditions #1, #3, #5 and #6 are verified after execution of the associated procedure 56b, 56c, 56d, 56e, 56f and 56i. In addition, a further subset of the verification conditions #10 and #11 are verified at the end of the simulation to ensure that no event which should have occurred did not occur.

It is understood that, while the procedures 56a to 56j are referred to as being distinct, the model 20 would contain one procedure to simulate a push or pop of data from the model 20 of the FIFO. Therefore, while procedures 56b and 56c are treated distinctly, model 20A need only comprise one procedure to push data, which will be used to simulate both significant events 54b and 54c. It is also understood that, in some cases, such as significant event 54j, there is no corresponding procedure which the model 20A need execute to simulate this significant event 54j. In this case, procedure 56j is an "empty" procedure in that no changes occur in the model 20A. Nevertheless, associated verification conditions #8 and #9 are still verified.

In addition to automatically applying the observed output 30 to the model 20, as illustrated in the example shown in FIGS. 2A, 2B, 3, 4A, 4B, 4C and 4D, the observed output 30 can be interactively applied to the model 20. In this case, external commands $E_C$ can be inputted by the user and sent to the interactive execution unit 24. This causes the simulation checker 13 to apply the significant events 34a to 34g and 54a to 54j of the observed output 30 to the model 20 in a specific order. In this way, the designer can step through the significant events 34a to 34g and 54a to 54j of the observed output 30, thereby controlling the procedures executed by the model 20 and observing changes in the state of the model 20.

In a further preferred embodiment, the simulation checker 13 can reconfigure models 20A, 20B, 20C of two or more parts A, B, C of the DUT 2. In this way, if models 20A, 20B of the parts A and B of DUT 2 have been prepared, the checker 13 will reconfigure the models 20A and 20B to generate a combined model 20 which generates model output 32 for both parts A and B of the DUT 2. The checker 13 will also reconfigure the verification conditions 23 by combining the verification conditions 23 set for the model output 32 of each of the parts A and B. This added adaptability of checker 13 allows designers to combine the various parts A, B and C of the DUT 2, the logs from loggers 4, 5, 6 and 7, and the models 20A, 20B, 20C of these parts A, B and C so as to verify results from the assembled DUT 2.

It is understood that, while the present method and simulation checker 13 have been described in terms of examples having log files, such as log files 40 shown in FIG. 2A and FIG. 3, the present method and simulation checker 13 can be used without a log file 40. In this case, the simulation checker 13 can directly observe the output from the DUT 2 and the parts A, B and C of the DUT 2 and apply this observed output to the model 20. In this case, the loggers 4, 5, 6 and 7 are not required and the simulation checker 13 will verify the observed output directly from the simulation verification environment 12.

It is further understood that if a log file 40 is generated from loggers 4, 5, 6 and/or 7, that the log file can constitute a single log file in which all of the loggers 4, 5, 6 and 7 log information regarding the observed output 30, or, each logger 4, 5, 6 and 7 may log in information into a separate file, or any combination of log files. Furthermore, if the log file is in a different format from the format which can be used by the model 20, it is understood that the log file can be converted to a format which can be used by the model 20, in such a way that the information regarding the significant events of the observed output 30 are not corrupted. In addition, it is understood that the log file 40 may be filtered, for example, by rounding off the time stamp or otherwise simplifying the observed output 30 in a non-significant manner, before application of the observed output 30 to the model 20.

It is further understood that the DUT 2 can be any type of device which can generate an output in response to external stimuli $E_S$. In particular, the DUT can be a chip, a core within a chip, a computer board comprising several chips, a computer system or a network. Likewise, the DUT 2 can be partitioned into any number of parts and along any well defined interface. For example, if the DUT 2 shown in FIG. 1 constituted a chip, the parts A, B and C could be cores within the chip having well defined internal and external interfaces. By way of a further example, if the DUT 2 was a board for use within a computer, the parts A, B and C could be individual chips used on the board, or, cores within chips used on the board. Likewise, if the DUT 2 was a network, the individual parts could constitute nodes linked to the network in order to test and verify the operation of the network as a whole.

It will be understood that, although various features of the invention have been described with respect to one or another of the embodiments of the invention, the various features and embodiments of the invention may be combined or used in conjunction with other features and embodiments of the invention as described and illustrated herein.

Although this disclosure has described and illustrated certain preferred embodiments of the invention, it is to be understood that the invention is not restricted to these particular embodiments. Rather, the invention includes all embodiments which are functional, electrical or mechanical equivalents of the specific embodiments and features that have been described and illustrated herein.

We claim:

1. A method for testing a device which generates output in response to external stimuli, said method comprising the steps of:

(a) generating a first set of observed output from the device by applying a first set of external stimuli to the device;

(b) generating a first set of model output by applying the first set of observed output to a model of the device;

(c) setting at least one verification condition which the model output should satisfy; and (d) determining if the model output does not satisfy one of the verification conditions.

2. The method as claimed in claim 1 wherein the model mimics external functions of the device in response to the observed output without simulating internal constructions of the device.

3. The method as claimed in claim 1 wherein the model is a non-cycle accurate model of the device.

4. The method as claimed in claim 1 wherein step (a) further comprises the step of storing information regarding the first set of observed output from the device; and wherein the stored information regarding the first set of observed output comprises information regarding significant events which occurred at external interfaces of the device and corresponding data associated with the significant events.

5. The method as claimed in claim 1 the information regarding the first set of observed output comprises information regarding significant events which occurred at external interfaces of the device and corresponding data associated with the significant events; and wherein step (b) of generating model output by applying the first set of observed output to a model of the device comprises the steps of:
(i) developing a non-cycle accurate model of the device comprising procedures which simulate significant events of the observed output without simulating internal constructions of the device; and
(ii) applying the observed output to the non-cycle accurate model of the device by executing procedures of the model which correspond to the significant events of the observed output in association with the corresponding data.

6. The method as claimed in claim 5 wherein the information regarding the first set of observed output comprises information regarding significant events which occurred at internal interfaces separating parts of the device and corresponding data; and wherein step (b) of generating model output by applying the first set of observed output to a model of the device comprises the steps of:
(i) developing a non-cycle accurate model of at least one part of the device said model comprising procedures which simulate significant events of the observed output at the internal and external interfaces without simulating internal constructions of the device; and
(ii) applying the observed output to the non-cycle accurate model of the device by executing procedures of at least one part of the model which correspond to the significant events of the observed output in association with the corresponding data associated with significant events.

7. The method as claimed in claim 6 further comprising the step of executing procedures corresponding to significant events interactively in response to external commands.

8. The method as claimed in claim 6 wherein the information regarding the first set of observed output comprises fields identifying the internal or external interface, a time of occurrence of the significant event and a type of the significant event; and wherein the step of applying the observed output to the model further comprises the step of parsing the information into components which can be used by the model.

9. The method as claimed in claim 6 further comprising the steps of:
(e) setting at least one new verification condition which the model output should satisfy; and
(f) determining if the model output does not satisfy one of the new verification conditions.

10. The method as claimed in claim 6 further comprising the step of repeating steps (a) to (d) for a second set of external stimuli, a second set of observed output generated by the device in response to the second set of external stimuli and a second set of model output generated by a model of the device in response to the second set of observed output.

11. A method for verifying observed output generated by a device in response to external stimuli, said method comprising the steps of:

(a) generating observed output from the device by applying a first set of external stimuli to the device;
(b) developing a model of the device which model can generate model output in response to the observed output;
(c) generating model output corresponding to the observed output by applying the observed output to the model of the device;
(d) setting at least one verification condition which the model output should satisfy; and
(e) determining if the model output does not satisfy one of the verification conditions.

12. The method as claimed in claim 11 wherein the model is a non-cycle accurate model developed by developing procedures which simulate external functions of the device without simulating internal constructions of the device; and wherein the model output corresponding to the observed output is generated by executing procedures which correspond to the observed output.

13. The method as claimed in claim 11 wherein said observed output comprises information regarding significant events and corresponding data having occurred during the simulation of the device;

wherein the model is a non-cycle accurate model of the device developed by developing procedures which simulate significant events of the observed output without simulating internal constructions of the device; and wherein the model output corresponding to the observed output is generated by executing procedures which correspond to the significant events of the observed output in association with the corresponding data.

14. The method as claimed in claim 13 further comprising the step of determining if the model output does not satisfy a subset of the at least one verification conditions before executing one of the procedures, said subset containing verification conditions associated with the procedure.

15. The method as claimed in claim 13 further comprising the step of determining if the model output does not satisfy a subset of the at least one verification conditions after executing one of the procedures, said subset containing verification conditions associated with the procedure.

16. The method as claimed in claim 13 further comprising the step of determining if the model output does not satisfy a subset of the at least one verification conditions after the model has executed procedures corresponding to all of the significant events of the observed output.

17. The method as claimed in claim 13 further comprising the step of:
(e) flagging at least one part of the model output which does not satisfy one of the verification conditions.

18. In a system for testing a device which generates observed output in response to external stimuli, a simulation checker comprising:

a model of the device which can generate model output in response to observed output generated by the device; and condition verification means for verifying that the model output satisfies predetermined verification conditions.

19. The simulation checker as claimed in claim 18 wherein the model of the device is a non-cycle accurate model which mimics external functions of the device in response to the observed output without simulating internal constructions of the device.

20. The simulation checker as claimed in claim 18 wherein said observed output comprises information regarding significant events and corresponding data having occurred during the simulation of the device;

wherein the model is a non-cycle accurate model of the device comprising procedures which simulate significant events of the observed output without simulating internal constructions of the device; and wherein the model output is generated by executing procedures which correspond to the significant events of the observed output in association with the corresponding data.

21. The simulation checker as claimed in claim 20 wherein the predetermined verification conditions comprise a first predetermined verification condition associated with a first procedure such that the first verification condition is verified before executing the first procedure.

22. The simulation checker as claimed in claim 21 wherein the predetermined verification conditions comprise a second predetermined verification condition associated with a second procedure such that the second verification condition is verified after executing the second procedure.

23. The simulation checker as claimed in claim 22 wherein the predetermined verification conditions comprise a third predetermined verification condition such that the third verification condition is verified after the model has executed procedures corresponding to all of the significant events of the observed output.

24. The simulation checker as claimed in claim 18 wherein the observed output comprises information regarding significant events which occurred at external interfaces of the device and internal interfaces separating parts of the device and corresponding data associated with the significant events:

wherein the model of the device comprises a non-cycle accurate model of at least one part of the device comprising procedures which simulate significant events of the observed output at internal and external interfaces of at least one part of the device without simulating internal constructions of the device; and wherein the model output of the non-cycle accurate model of the device is generated by executing procedures which simulate significant events of the observed output in association with the corresponding data, observed at internal and external interfaces of the at least one part.

25. The simulation checker as claimed in claim 24 wherein if the model of the device comprises a non-cycle accurate model of the at least two parts of the device having common interfaces, the simulation checker re-configures the non-cycle accurate models of the at least two parts of the device to generate a combined model output of the non-cycle accurate models of the at least two parts.

26. The simulation checker as claimed in claim 24 wherein the information regarding the observed output comprises fields identifying the internal or external interface, a time of occurrence of the significant event and a type of the significant event; and wherein the checker parses the information into components which can be applied to the model.

27. The simulation checker as claimed in claim 20 wherein the predetermined verification conditions of the condition verification means can be changed.

28. The simulation checker as claimed in claim 20 further comprising interactive execution means for executing procedures in response to external commands.

29. The simulation checker as claimed in claim 18 wherein the condition verification means flags a part of the model output which does not satisfy one of the verification conditions.

* * * * *